United States Patent
Chang et al.

(10) Patent No.: US 9,551,070 B2
(45) Date of Patent: Jan. 24, 2017

(54) IN-SITU CORROSION RESISTANT SUBSTRATE SUPPORT COATING

(71) Applicant: APPLIED MATERIALS, INC., Santa Clara, CA (US)

(72) Inventors: Mei Chang, Saratoga, CA (US); Chien-Teh Kao, Sunnyvale, CA (US); Juno Yu-Ting Huang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 43 days.

(21) Appl. No.: 14/291,781

(22) Filed: May 30, 2014

(65) Prior Publication Data

US 2015/0345017 A1 Dec. 3, 2015

(51) Int. Cl.
| | | |
|---|---|---|
| *C23C 16/455* | (2006.01) | |
| *C23C 16/22* | (2006.01) | |
| *C23C 16/44* | (2006.01) | |
| *C23C 16/458* | (2006.01) | |
| *H01J 37/32* | (2006.01) | |

(52) U.S. Cl.
CPC ......... *C23C 16/45525* (2013.01); *C23C 16/22* (2013.01); *C23C 16/4401* (2013.01); *C23C 16/4581* (2013.01); *H01J 37/32477* (2013.01); *H01J 37/32715* (2013.01)

(58) Field of Classification Search
CPC .. C23C 16/45525; C23C 16/06; C23C 16/458; C23C 16/12
See application file for complete search history.

(56) References Cited

U.S. PATENT DOCUMENTS

| | | | |
|---|---|---|---|
| 8,270,141 B2 | 9/2012 | Willwerth et al. | |
| 9,222,172 B2 * | 12/2015 | Rasheed | C23C 16/4404 |
| 2002/0173167 A1 * | 11/2002 | Krishnaraj | C23C 16/401 438/778 |
| 2003/0183244 A1 * | 10/2003 | Rossman | B08B 7/0035 134/1.1 |
| 2007/0089836 A1 | 4/2007 | Metzner et al. | |
| 2011/0315081 A1 | 12/2011 | Law et al. | |
| 2012/0103526 A1 * | 5/2012 | Ouye | H01J 37/32495 156/345.51 |
| 2014/0159325 A1 * | 6/2014 | Parkhe | H01L 21/67109 279/128 |
| 2015/0036260 A1 * | 2/2015 | Cox | H01L 21/6833 361/234 |
| 2015/0376780 A1 * | 12/2015 | Khaja | C23C 16/4405 134/1.1 |

* cited by examiner

*Primary Examiner* — Savitr Mulpuri
(74) *Attorney, Agent, or Firm* — Moser Taboada; Alan Taboada

(57) ABSTRACT

Corrosion resistant substrate supports and methods of making corrosion resistant substrate supports are provided herein. In some embodiments, a method of making corrosion resistant substrate supports includes exposing the substrate support disposed within a substrate processing chamber to a process gas comprising an aluminum containing precursor; and depositing an aluminum containing layer atop surfaces of the substrate support.

8 Claims, 3 Drawing Sheets

IN-SITU CORROSION RESISTANT SUBSTRATE SUPPORT COATING

FIELD

Embodiments of the present disclosure generally relate to corrosion resistant substrate supports and methods of making corrosion resistant substrate supports.

BACKGROUND

Thin films are generally fabricated in process chambers selectively adapted for performing various deposition, etch, and thermal processes, among other processes, upon substrates, such as silicon (Si) wafers, gallium arsenide (GaAs) wafers, glass or sapphire substrates, and the like. These processes often use or develop process environments (e.g., environments containing aggressive chemistries, plasmas, by-products, etc.) that may gradually erode, consume, or contaminate various exposed components of the processing chambers, such as substrate supports, substrate lift pins, process kits (e.g., heat rings, deposition rings, retaining rings, and the like), process shields (heat shields, plasma shields, and the like), and the like. As such, these components are periodically inspected, refurbished (e.g., cleaned), and/or replaced—typically, on a set maintenance schedule (e.g., after a predetermined number of manufacturing cycles).

One such material is silicon carbide (SiC). As an example, many process chambers utilize components, such as a substrate support, fabricated from graphite having a silicon carbide coating or fabricated substantially completely from silicon carbide. A silicon carbide coating is typically formed via chemical vapor deposition (CVD) upon the graphite components. However, the corrosive chemistries used in a process chamber, such as but not limited to chlorine or fluorine containing chemistries, will react with the SiC material and oxidize carbon atoms from the material. The rapid deterioration of the SiC leads to more frequent refurbishment and/or replacement of components. Currently, SiC components can be protected by applying an ex-situ coating, such as by plasma spray or ion assisted deposition. However, such processes have challenges such as cracking and delamination at high temperatures, poor conformability of coating material to susceptor architecture, increased lead time and poor coating quality.

Accordingly, the inventors have developed improved corrosion resistant substrate supports and methods of forming corrosion resistant substrate supports.

SUMMARY

Corrosion resistant substrate supports and methods for forming corrosion resistant substrate supports are provided herein. In some embodiments, a method of treating a substrate support includes exposing the substrate support disposed within a substrate processing chamber to a process gas comprising an aluminum containing precursor; and depositing an aluminum containing layer atop surfaces of the substrate support.

In some embodiments, a method of depositing a fluorine etch resistant coating atop a substrate support includes: exposing the substrate support disposed within a substrate processing chamber to a process gas comprising an aluminum containing precursor and an oxidant; and depositing an aluminum containing layer atop surfaces of the substrate support, wherein the layer is deposited atop the substrate support at least one of: prior to depositing a material atop a surface of a substrate disposed on the substrate support, prior to in-situ cleaning of the process chamber following depositing the material atop the surface of the substrate disposed on the substrate support, or after the in-situ cleaning of the process chamber following depositing the material atop the surface of the substrate disposed on the substrate support.

In some embodiments, a computer readable medium is provided having instructions stored thereon that, when executed, causes a process chamber to perform a method for depositing a layer atop a substrate support within a processing chamber. The method may include any of the methods disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
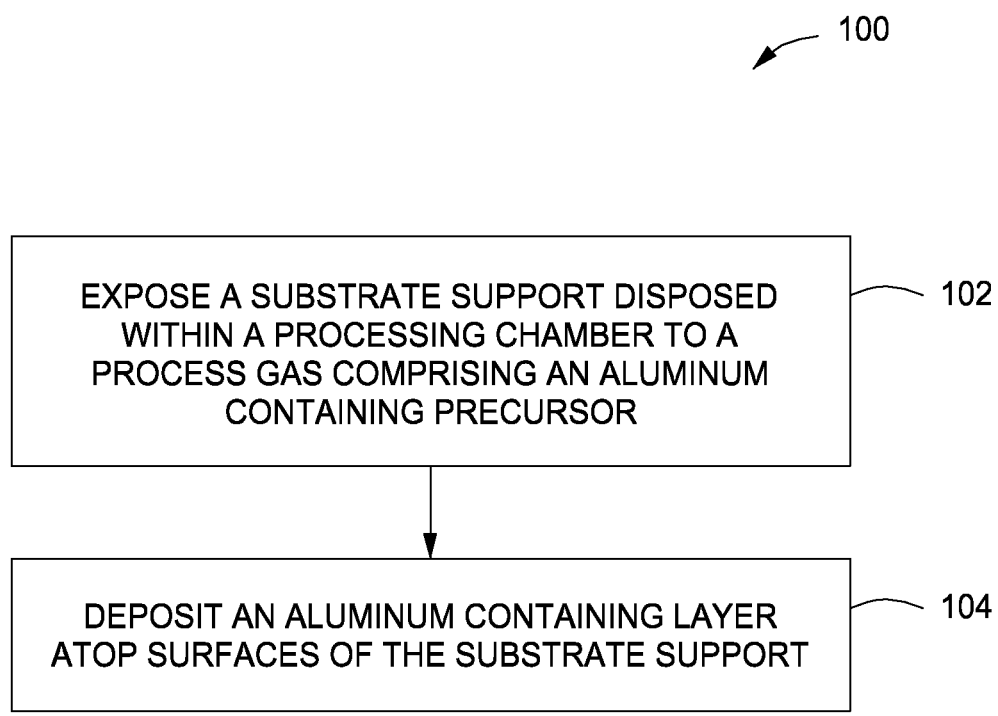
FIG. 1 depicts a flow chart for a method of depositing a layer atop a substrate support within a processing chamber in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Improved corrosion resistant substrate supports and methods of forming corrosion resistant substrate supports are disclosed herein. In some embodiments, the corrosion resistant substrate support formed herein may be used with any suitable process chamber and exposed to corrosive process chamber chemistries, such as but not limited to chlorine or fluorine containing process chemistries. The in-situ formation of a corrosion resistant substrate support coating offers several advantages as compared to typical ex-situ methods such as plasma spray coating or ion assisted deposition coating. For example, an in-situ coating provides advantages such as lower cost, reduced lead time, quality control via chamber growth process conditions, improved step coverage and conformal coating, improved substrate bonding, improved thickness uniformity, no air breaks leading to elimination of outgassing of coating materials due to airborne contaminants, elimination of thermal cycling between the coating process and subsequent deposition process, reduction in coating material porosity and cracking, improved on-wafer defect performance, improved thermal and chemical stability, high thermal conductivity, low thermal expansion coefficient, low thermal mismatch between substrate support materials an coating material, and reduced pitting in substrate support to minimize crevice corrosions. Other benefits may also be realized via the methods and structures disclosed herein.

The inventors have observed that process chamber components in typical chemical vapor deposition processes or atomic layer deposition processes are frequently exposed to corrosive chemistries that can corrode chamber components. For example, chemical precursors used in chemical vapor deposition (CVD) or atomic layer deposition (ALD) processes for depositing layers atop a substrate may contain corrosive elements that can corrode chamber components. Alternatively, chamber components may be exposed to corrosive chemistries during in-situ chamber cleaning processes, typically using a fluorine containing gas or a chlorine containing gas. For example, typically the deposition of cobalt onto semiconductor wafers via a CVD or ALD process can result in a layer of cobalt residue adhering to the surfaces of various process chamber components such as the substrate support. The cobalt residue can flake off surfaces of the chamber components resulting in contamination during semiconductor wafer processing. As a result, chamber components having cobalt residue are typically cleaned, for example, by forming a plasma from a process gas comprising a fluorine-containing gas such as one of fluorine gas ($F_2$), nitrogen trifluoride ($NF_3$), a fluorocarbon ($C_xF_y$), or tungsten hexafluoride ($WF_6$).

The inventors have observed that a substrate support or components of a substrate support, specifically a susceptor, may be composed of a material that is especially susceptible to corrosion from fluorine containing gases or a chlorine containing gases. For example, in some embodiments, a susceptor may be composed of silicon carbide which is easily etched by fluorine radicals or by chlorine radicals at high temperature processes. The inventors have further observed that while a corrosive resistant coating may be applied to a substrate support or components of a substrate support ex-situ (i.e., outside of the process chamber prior to installation of the substrate support in the process chamber), such a process has several disadvantages, for example, such as cracking and delamination at high temperatures, poor conformability of coating material to susceptor architecture, increased lead time, and poor coating quality. The inventors have observed that applying a corrosive resistant coating in-situ provides significant advantages and benefits, such as those described above. As used herein, "in-situ" means to deposit the corrosive resistant coating within the same process chamber that is used to perform subsequent process steps, such as depositing a desired layer atop a substrate.

FIG. 1 depicts a flow chart of a method 100 for forming a corrosive resistant coating atop a substrate support in accordance with some embodiments of the present disclosure. The method 100 may be performed in any suitable process chambers, such as the process chamber 200 described below with respect to FIG. 2, configured for one or more of chemical vapor deposition (CVD) or atomic layer deposition (ALD).

The inventors have observed that the substrate support may be coated with any material suitable for protecting a substrate support, for example a silicon carbide (SiC) susceptor, from corrosive chemistries. Examples of suitable materials include an aluminum containing layer (e.g., consisting essentially of AlO or AlN), a hafnium containing layer (e.g., consisting essentially of HfO or HfN), or a zirconium containing layer (e.g., consisting essentially of ZrO or ZrN). The inventors have observed that a coating of an aluminum containing layer is advantageous due to the ease of availability of aluminum containing precursors.

The method 100 begins at 102 where a substrate support disposed within a process chamber, such as the process chamber 200 described below, is exposed to a process gas comprising an aluminum containing precursor. The aluminum containing precursor gas may be one or more of trimethylaluminum, triethylaluminum, tris(diethylamino) aluminum, hexakis(dimethylamido)dialuminum. In some embodiments, the substrate is exposed to the aluminum containing precursor gas at a suitable flow rate for depositing an aluminum containing layer at a desired thickness.

In some embodiments, the process gas may further comprise an oxidant. In some embodiments, the oxidant is one of a suitable nitrogen-containing gas or a suitable oxygen-containing gas. In some embodiments, a suitable nitrogen containing gas can be, for example, a gas that provides nitrogen and other essentially non-reactive elements, such as ammonia ($NH_3$), nitrogen ($N_2$), an amine (such as, methylamine, dimethylamine, or diethylamine), or combinations thereof. In some embodiments, a suitable oxygen containing gas can be, for example, a gas that provides oxygen and other essentially non-reactive elements, such as ozone ($O_3$), nitric oxide (NO), nitrous oxide ($N_2O$), oxygen ($O_2$), water vapor ($H_2O$), or combinations thereof. Optionally, the first process gas may further include an inert gas, such as a noble gas, for example, argon (Ar), helium (He), krypton (Kr), or the like, or combinations thereof. In some embodiments, the oxidant comprises ammonia ($NH_3$), or nitrogen ($N_2$) and hydrogen ($H_2$), or mixtures thereof. In some embodiments, the process gas comprises ammonia ($NH_3$) and an inert gas, for example, argon (Ar). The oxidant may be provided at a suitable flow rate for depositing the aluminum containing layer at a desired thickness.

Next, at 104, an aluminum containing layer is deposited atop surfaces of the substrate support. In some embodiments, the aluminum containing layer is deposited in-situ atop the substrate support using an atomic layer deposition (ALD) process. In some embodiments, such as where the aluminum containing layer is aluminum oxide, the ALD process may comprise depositing a first layer using an aluminum-containing gas, depositing a second layer using an oxygen-containing gas, and purging the process chamber with an inert gas, wherein the deposition of each layer and the purging of the process chamber comprise one cycle. It is contemplated that multiple cycles may be necessary to deposit an aluminum oxide layer having sufficient thickness and quality for serving as an adequate corrosive resistant coating. In some embodiments, the aluminum-containing gas comprises the aluminum containing precursor gases listed above. In some embodiments, the aluminum-containing gas may be flowed in combination with an inert gas, such as nitrogen ($N_2$) or argon (Ar). In some embodiments, the oxygen-containing gas comprises oxygen ($O_2$). In some embodiments, the oxygen-containing gas may be flowed in combination with an inert gas such as nitrogen ($N_2$) or argon (Ar). In some embodiments, purging may be performed using an inert gas such as nitrogen ($N_2$) or argon (Ar). The inventors have observed that depositing the aluminum containing layer using an ALD process may advantageously produce a more conformal coating atop the substrate support.

In some embodiments, the aluminum containing layer is deposited in-situ atop the substrate support using a chemical vapor deposition (CVD) process, for example a plasma enhanced chemical vapor deposition process. In such embodiments, the substrate support may be exposed to the aluminum containing precursor in a plasma state. The plasma may be formed by coupling sufficient energy, for example radio frequency (RF) energy from a power source to ignite the aluminum containing precursors to form the plasma. The plasma facilitates a decomposition of the aluminum containing precursor, causing a deposition of material on the substrate, thereby forming the aluminum containing layer.

General processing conditions for forming the aluminum containing layer discussed above may include any one or more of maintaining the process chamber at a temperature of about 100 degrees Celsius to about 500 degrees Celsius, for example about 200 degrees Celsius to about 450 degrees Celsius, and maintaining the process chamber pressure at about 600 mTorr to about 10 Torr.

The inventors have also observed that adjusting the temperature of the ALD process can produce a desired crystalline quality (e.g. amorphous or polycrystalline) of the aluminum containing layer coating. For example, as the temperature of the ALD process increases, the crystallinity (i.e. grain size) of the aluminum containing layer increases. The inventors have observed that larger grain sizes may lead to cracking at grain boundaries, thus rendering them undesirable. The thickness of the aluminum containing layer also affects the crystallinity of the layer. For example, a thinner aluminum containing layer will have smaller grain size than a thicker layer, thereby having better adhesion to an underlying surface.

The composition of the aluminum containing layer can be adjusted by adjusting the process time the substrate is exposed to the aluminum containing precursor. For example, in some embodiments, the substrate may be exposed to the aluminum containing precursor for a first period of time to form an aluminum containing layer to a desired thickness on the surface of the substrate. The thickness of the aluminum containing layer may be from about 100 angstroms to about 2 microns. The inventors have observed that applying the aluminum containing layer in-situ may allow the use of a thinner protective coating than an ex-situ protective coating because the layer may be more easily re-applied as needed.

Figure 3:
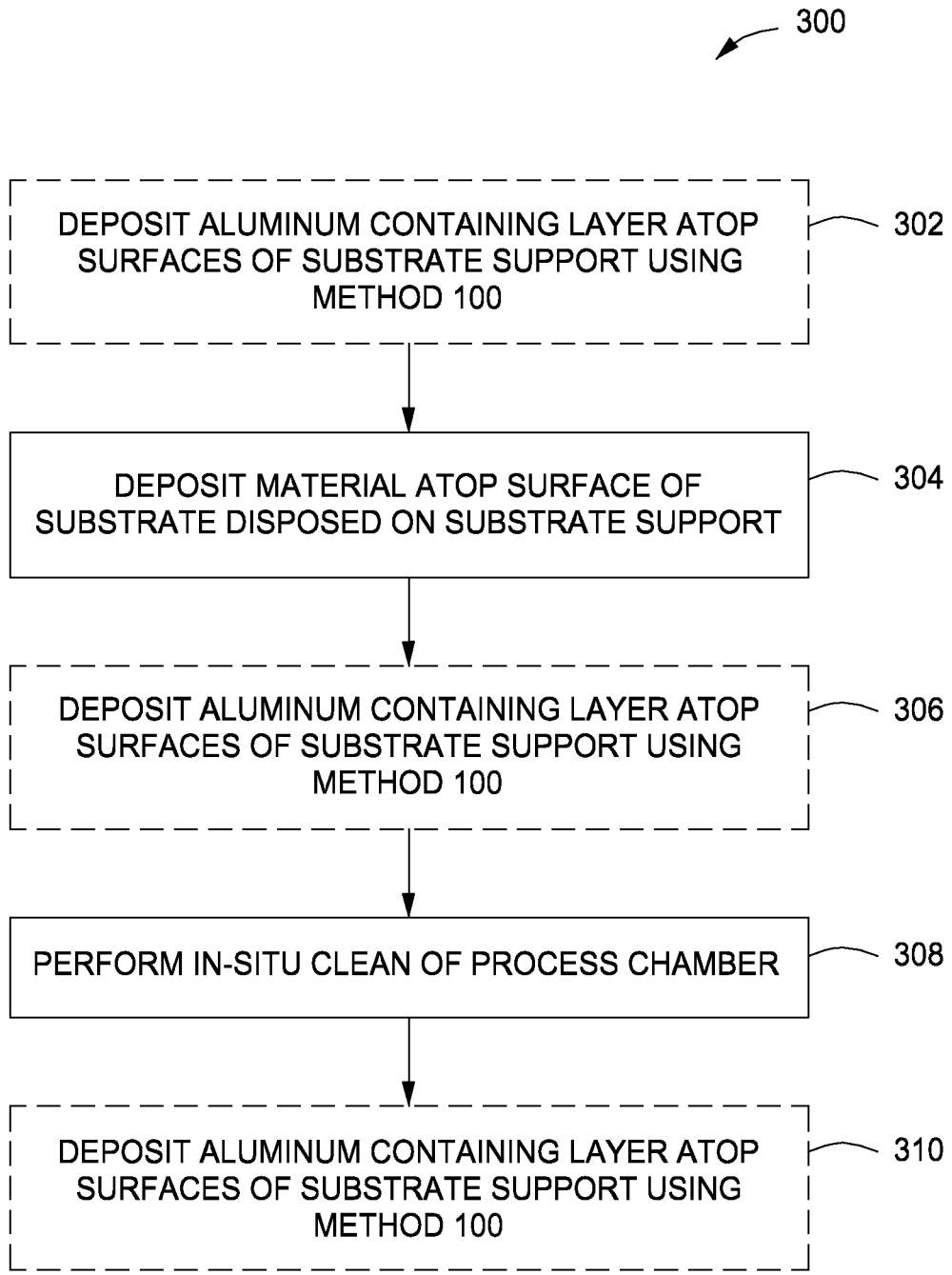
FIG. 3 depicts a flow chart for a method of depositing a layer atop a substrate support within a processing chamber in accordance with some embodiments of the present disclosure.

The inventors have observed that applying the corrosive resistant coating in-situ advantageously allows flexibility in applying the corrosive resistant coating during a process. For example, FIG. 3 depicts a method 300 of applying the corrosive resistant coating during substrate processing. At 302, the corrosive resistant coating may optionally be deposited atop the substrate support prior to depositing a material, such as cobalt, atop a surface of a substrate disposed on the substrate support within the processing chamber at 304. At 306, the corrosive resistant coating may optionally be deposited atop the substrate support prior to in-situ cleaning of the process chamber at 308 following depositing material atop the substrate at 304. At 310, the corrosive resistant coating may optionally be deposited atop the substrate support after the in-situ cleaning process at 308. In some embodiments, the method 300 may optionally perform each of 302, 306, and 310 or may optionally perform any one of 302, 306, and 310 or may optionally perform any combination of 302, 306, and 310.

In some embodiments, depositing a layer of material, such as cobalt, atop the substrate at 304 comprises placing a substrate in the substrate processing chamber, atop the substrate support, after depositing the corrosive resistant coating at 302. In some embodiments, a dummy substrate may be placed atop the substrate support prior to depositing the corrosive resistant coating at 302 and replaced with the substrate on which material is to be deposited. In some embodiments, depositing the corrosive resistant coating at 302 and depositing the layer of material at 304 are performed at temperatures within about 200 degrees Celsius of each other, thus providing lower cost, reduced lead time, and reduction of thermal cycling between the coating process and subsequent deposition process.

In some embodiments depositing the layer of material, such as cobalt, atop the substrate at 304 also results in deposition of the material on the substrate support. In such embodiments, at 306, the substrate support is re-exposed to the process gas to deposit a second corrosive resistant coating atop surfaces of the substrate support and atop the material deposited on the substrate support, to advantageously trap the material deposited on the substrate support and prevent flaking or particle generation from the material.

In some embodiments, the processed substrate is removed from the process chamber prior to in-situ cleaning of the process chamber at 308. At 310, a corrosive resistant coating may be deposited atop the substrate support after the in-situ clean, either with or without a dummy substrate atop the substrate support.

The method may be repeated as desired to maintain a corrosive resistant coating atop surfaces of the substrate support, such as repeating after material deposition on each substrate, after a batch of substrates, or after any number of substrates that it is determined that the corrosive resistant coating atop surfaces of the substrate support is necessary or desired. Alternatively or in combination, the corrosive resistant coating may be deposited atop surfaces of the substrate support after cleaning the chamber or other exposure to corrosive gases, such as fluorine-containing gases.

Figure 2:
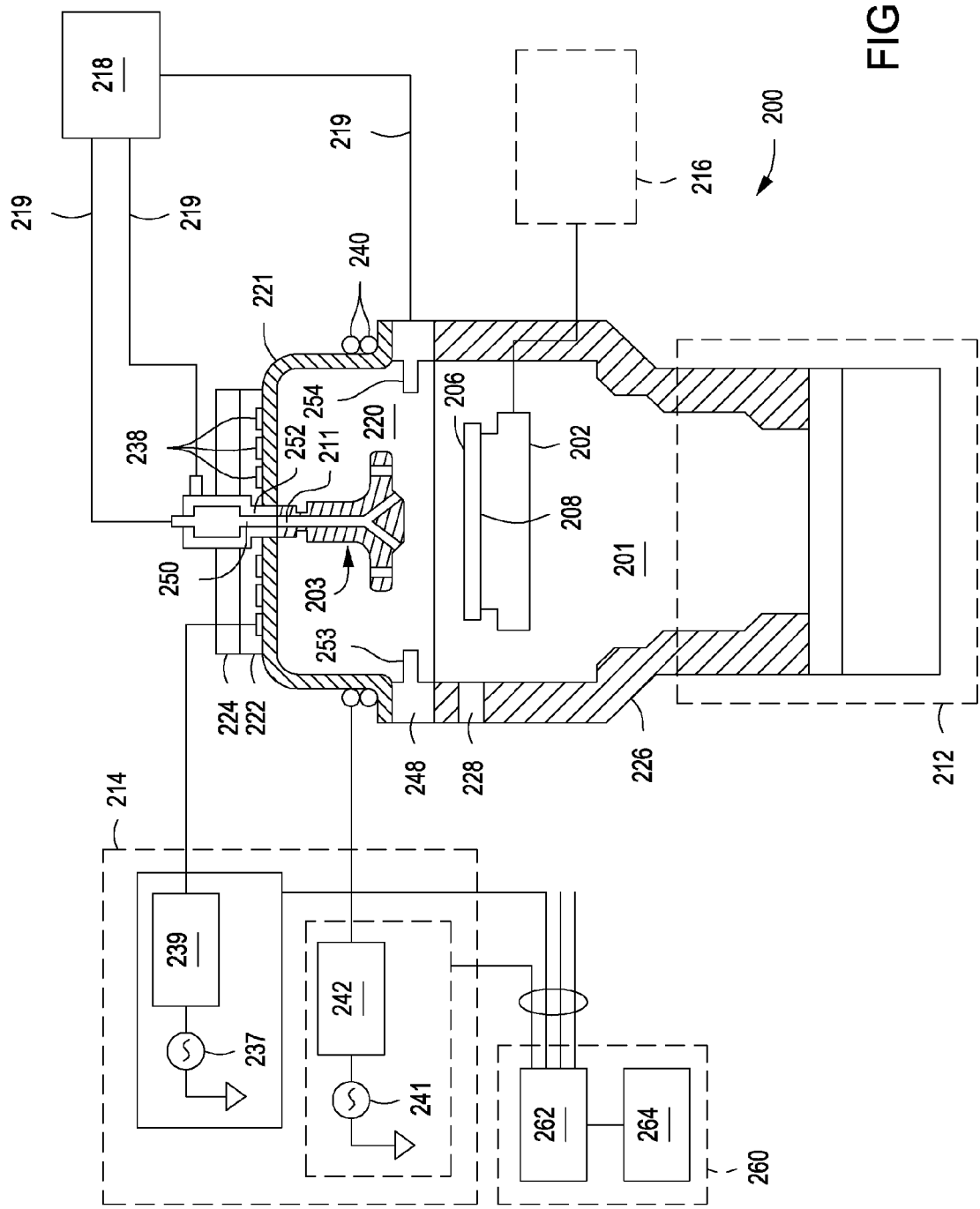
FIG. 2 depicts a schematic, cross-sectional view of an illustrative process chamber used in accordance with some embodiments of the present disclosure.

FIG. 2 depicts a schematic, cross-sectional view of an exemplary process chamber (process chamber 200) in accordance with some embodiments of the present disclosure. Examples of chambers suitable for performing the method described herein include the 300 mm HDP-CVD ULTIMA X and CENTURA® ULTIMA HDP-CVD both available from Applied Materials, Inc. of Santa Clara, Calif. Other process chambers, including those from other manufacturers, may also be suitably used in connection with the teachings provided herein.

The process chamber 200 comprises an inner volume 201 with a substrate support 202. The process chamber 200 may further include a vacuum system 212, a source plasma system 214, a bias plasma system 216, a gas delivery system 218, and a remote plasma cleaning system (not shown).

The substrate support 202 may be disposed in the process chamber 200 to support a substrate 206 positioned thereupon during the processing. The substrate support 202 may include various components, such as a susceptor 208 used to hold a substrate 206 in the inner volume 201 of the substrate processing chamber 200. A process kit (not shown) may optionally be used to cover at least one portion of the substrate support 202 that is not covered by the substrate 206 when the substrate 206 is disposed thereon. The process kit may be configured to provide reduced contamination of surface of the substrate 206 during the processing, and reduced cleaning time during chamber cleaning processes.

The susceptor 208 may be fabricated from any process compatible material, such as monolithic silicon carbide (SiC), or may be formed from graphite and coated with SiC. In some embodiments comprising monolithic SiC, the susceptor 208 may be sintered from SiC powder to a net shape (e.g., a final shape), or near net shape and then processed further to a net shape. In some embodiments, the susceptor 208 may be formed from graphite by sintering as above, or by machining from a block of graphite material. Graphite susceptors are sometimes coated with a SiC coating using any suitable method to coat the desired surface. The susceptor 208 may have a substrate supporting surface configured to support a substrate 206 during processing.

An upper portion of process chamber 200 may include a dome 221, which may be made of a dielectric material, such as alumina or aluminum nitride. The dome 221 defines an upper boundary of a plasma processing region 220. The plasma processing region 220 is bounded on the bottom by the substrate 206 and the substrate support 202.

A heater plate 222 and a cold plate 224 surmount, and are thermally coupled to, the dome 221. The heater plate 222 and the cold plate 224 allow control of the dome temperature to within about +/−10 degrees Centigrade over a range of about 100 to 200 degrees Centigrade. This allows optimizing the dome temperature for the various processes. For example, it may be desirable to maintain the dome at a higher temperature for cleaning or etching processes than for deposition processes. Accurate control of the dome temperature also reduces the flake or particle counts in the process chamber and improves adhesion between the deposited layer and the substrate.

The dome 221 may include a top nozzle 250 and a top vent 252 disposed therein and therethrough, which may be utilized to introduce gases into the process chamber 200 as discussed further below with respect to the gas delivery system 218. The top nozzle 250 is optionally coupled to a baffle 203 disposed within the process chamber 200 at a gas inlet 211 and the top vent 252 is open to the process chamber 200 and is directed towards a backside of the baffle 203.

The baffle 203, when present, generally includes a body having a shape for directing process gases as desired within the process chamber. For example, the baffle 203 may be disposed between a gas inlet (such as top nozzle 250) and a substrate support (such as substrate support 202) and may include a backside separated from and opposing the dome 221, and a frontside disposed opposite the substrate 206 and substrate support 202 in order to direct the process gases as desired.

A lower portion of the process chamber 200 may include a body member 226, which joins the process chamber 200 to the vacuum system 212. The substrate support 202 may be mounted in the body member 226. The substrate 206 may be transferred into and out of the process chamber 200 by a robot blade (not shown) through an insertion/removal opening 228 inside of the process chamber 200. A pneumatic actuator (not shown) raises and lowers a lift-pin plate (not shown) that raises and lowers lift pins (not shown) that raise and lower the substrate 206. Upon transfer into the process chamber 200, the substrate 206 is disposed on the raised lift pins, and then lowered onto the surface of the substrate support 202.

The source plasma system 214 includes a top coil 238 and a side coil 240, mounted on the dome 221. A symmetrical ground shield (not shown) reduces electrical coupling between the top coil 238 and the side coil 240. The top coil 238 is powered by a top RF source generator 237, while the side coil 240 is powered by a side RF source generator 241, allowing independent power levels and frequencies of operation for each coil. This dual coil system allows control of the radial ion density in the process chamber 200, thereby improving plasma uniformity. The side coil 240 and the top coil 238 couple energy into the process chamber 200 inductively. The top RF source generator 237 may provide up to 8000 W of RF power at nominally 2 MHz and the side RF source generator 241 may provide up to 8000 W of RF power at nominally 2 MHz. Operating frequencies of the top RF generator 237 and the side RF generator 241, may be offset from the nominal operating frequency (e.g., to 1.7-1.9 MHz and 1.9-2.1 MHz, respectively) to improve plasma-generation efficiency.

In some embodiments, the RF generators 237 and 241 include digitally controlled synthesizers and operate over a frequency range from about 1.7 to about 2.1 MHz. Each of the generators 237 and 241 includes an RF control circuit (not shown) that measures reflected power from the process chamber 200 and the coils 238 and 240, back to the generator, and adjusts the operating frequency to obtain the lowest reflected power, as understood by a person of ordinary skill in the art. The RF generators 237 and 241 are typically designed to operate into a load with a characteristic impedance of 50 ohms. RF power may be reflected from loads that have different characteristic impedance than the generator. This may reduce power transferred to the load. Additionally, power reflected from the load back to the generator may overload and damage the generator. Because the impedance of the plasma may range from less than 5 ohms to over 900 ohms, depending on the plasma ion density among other factors, and because the reflected power may be a function of frequency, adjusting the generator frequency according to the reflected power increases the power transferred from the RF generator to the plasma and protects the generator. Another way to reduce reflected power and improve efficiency is with a matching network.

Matching networks 239 and 242 match the output impedance of the RF generators 237 and 241 with the coils 238 and 240, respectively. The RF control circuit may tune the matching networks 239 and 242 by changing value of capacitors within the matching networks 239 and 242 to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help to stabilize the plasma under some conditions by holding the matching network constant at its most recent condition.

The bias plasma system 216 serves to enhance the transport of the plasma species created by the source plasma system 214 to the surface of the substrate 206.

The gas delivery system 218 may include multiple gas sources (not shown). In some embodiments, the gas sources may comprise suitable materials, as discussed above, for forming the corrosive resistant coating and for subsequent material deposition processes. The gas delivery system 218 provides gases from several sources to the process chamber 200 for processing the substrate 206 via gas delivery lines 219 (only some of which are shown). Gases are introduced into the process chamber 200 through a gas ring 248, the top nozzle 250, and the top vent 252. The gas sources may be provided to the gas ring 248, the top nozzle 250, and the top vent 252 via flow controllers (not shown) and the gas delivery line 219. The gas delivery line 219 may have a flow controller (not shown) to control the flow rate of a process gas. The top nozzle 250 and the top vent 252 allow independent control of top and side flows of the gases, which improves film uniformity and allows fine adjustment of the deposition layer and doping parameters. The top vent 252 is an annular opening around the top nozzle 250 through which the gas may flow into the process chamber 200 from the gas delivery system 218.

The gas is provided from one or more gas sources of the gas delivery system 218 to the gas ring 248 via flow controllers and the gas delivery lines 219. The gas ring 248 has multiple gas nozzles 253 and 254 (only two of which is shown) that provide a uniform flow of the gas over the substrate 206. Nozzle length and nozzle angle may be changed by changing the gas ring 248. This allows tailoring the uniformity profile and gas utilization efficiency for a particular process within the process chamber 200. In some embodiments, the gas nozzles 254 (only one of which is shown), are coplanar with, and shorter than, the second gas nozzles 253.

A system controller 260 regulates the operation of the plasma-based substrate processing system and includes a processor 262 and a memory 264. The processor 262 executes system control software, which may be a computer program stored in the memory 264. Any type of the memory 264 may be employed. The system control software includes sets of instructions that dictate the operation of the process chamber 200, including the methods described above.

While the foregoing is directed to embodiments of the present disclosure, other and further embodiments of the disclosure may be devised without departing from the basic scope thereof.

The invention claimed is:

1. A method of treating a substrate support, comprising:
exposing the substrate support disposed within a substrate processing chamber to a process gas comprising an aluminum containing precursor;
depositing a first aluminum containing layer atop surfaces of the substrate support;
placing a substrate in the substrate processing chamber and atop the substrate support after depositing the first aluminum containing layer;
exposing the substrate support to chemical precursors having corrosive elements to deposit a layer of material atop the substrate, and resulting in deposition of the layer of material on the substrate support;
performing an in-situ clean of the substrate processing chamber following depositing the layer of material atop the surface of the substrate; and
re-exposing the substrate support disposed within the substrate processing chamber to the process gas to deposit a second aluminum containing layer atop surfaces of the substrate support and atop the material deposited on the substrate support, wherein the second aluminum containing layer is deposited at least one of prior to performing the in-situ clean of the substrate processing chamber or after performing the in-situ clean of the substrate processing chamber.

2. The method of claim 1, wherein the aluminum containing precursor gas is one of trimethylaluminum, triethylaluminum, tris(diethylamino) aluminum, hexakis (dimethylamido) dialuminum.

3. The method of claim 1, wherein the process gas further comprises an oxidant.

4. The method of claim 3, wherein the oxidant is one of an oxygen-containing gas or a nitrogen-containing gas.

5. The method of claim 1,
wherein the corrosive element is at least one of a fluorine containing process gas or a chlorine containing process gas.

6. The method of claim 1, wherein the substrate support comprises a silicon carbide body.

7. The method of claim 1, further comprising:
depositing a layer of material atop the substrate, wherein depositing the aluminum containing layer and depositing the layer of material are performed at temperatures within about 200 degrees Celsius of each other.

8. The method of claim 1, further comprising adjusting a temperature of the substrate processing chamber during exposure of the substrate support to the process gas to deposit an aluminum containing layer having one of an amorphous crystal structure or a polycrystalline structure.

* * * * *